United States Patent [19]

Lavelle

[11] Patent Number: 4,785,425
[45] Date of Patent: Nov. 15, 1988

[54] ELECTRONIC LOCKING SYSTEM

[75] Inventor: Gary E. Lavelle, Avon, Conn.

[73] Assignee: Emhart Industries, Inc., Farmington, Conn.

[21] Appl. No.: 20,057

[22] Filed: Feb. 27, 1987

[51] Int. Cl.$^4$ .................. H04Q 00/00; G06F 1/00; G11C 7/00; G11C 17/00

[52] U.S. Cl. .................................. 365/52; 365/94; 365/189; 364/200; 340/825.5

[58] Field of Search ............... 365/52, 185, 94, 189, 365/230; 364/200, 465, 509; 340/825.5

[56] References Cited

U.S. PATENT DOCUMENTS

| | | | |
|---|---|---|---|
| 4,680,731 | 7/1987 | Izumi et al. | 365/52 |
| 4,698,750 | 10/1987 | Wilkie et al. | 364/200 |
| 4,730,187 | 5/1988 | Menich et al. | 340/825.5 |

Primary Examiner—Terrell W. Fears
Assistant Examiner—Melissa J. Koval
Attorney, Agent, or Firm—Arthur J. Samodovitz; Arthur B. Moore; Barry E. Deutsch

[57] ABSTRACT

A field programmable electronic locking system includes a processor and an electrically erasable programmable read-only memory (EEPROM). The processor has address outputs electrically connected to address inputs of the EEPROM to address memory locations within the EEPROM, data inputs electrically connected to data inputs/outputs of the EEPROM to receive data from the EEPROM, and a high-impedance control input for transforming the address outputs of the processor to a high-impedance state. An EEPROM programmer activates the high-impedance control input of the processor to render the address outputs of the processor to a high-impedance state during a programming operation, and transmits address information and data to the address inputs and data inputs/outputs of the EEPROM, respectively during the programming information to write data into said EEPROM. Consequently, the EEPROM need not be removed from its socket or printed circuit board during programming, and may be programmed in the field.

13 Claims, 2 Drawing Sheets

ELECTRONIC LOCKING SYSTEM

BACKGROUND OF THE INVENTION

The invention relates generally to electronic locking systems and deals more particularly with an electronic lock including a processor and a memory device which memory device is programmable without removal from its socket or printed circuit board, such programmability being suitable for field service.

Electronic locks of a type with which this invention is concerned contain a processor and a read-only memory (ROM) electrically connected to the processor to provide a computer program to operate the processor. Various types of read-only memories are known in the electronics industry including an electrically erasable programmable read-only memory (EEPROM) and other programmable read-only memories (PROM).

In the past, the PROM has been programmed before installation in a circuit board within the electronic lock. Such programming was accomplished by plugging the PROM into a programmer. After the programming, the PROM was plugged into a printed circuit board along with the processor. The printed circuit board included electrical conductors which connected inputs and outputs of the processor to the inputs and outputs of the PROM. Then the PROM was soldered into the printed circuit board along with the process to prevent the PROM from coming loose during the vibrations caused by opening and closing a door to which the electronic lock was subsequently attached.

Occasionally, it may be desirable to program a memory device after installation and soldering in the printed circuit board. This may occur out in the field during a job change or during replacement of a defective circuit board with a new, unprogrammed circuit board.

Accordingly, a general object of the present invention is to provide an electrponic lock having a memory device which memory device may be programmed or reprogrammed without removal from its soeket or circuit board.

A more specific object of the present invention is to provide an electronic lock of the foregoing type which is programmable out in the field.

SUMMARY OF THE INVENTION

The invention is adapted to an electronic locking system having a processor and an electrically erasable programmable read-only memory (EEPROM). The processor has address outputs electrically connected to address inputs of the EEPROM to address memory locations within the EEPROM, data inputs electrically connected to data inputs/outputs of the EEPROM to receive data from the EEPROM, and a high-impedance control input for transforming the address outputs of the processor to a high-impedance state.

A connector electrically connects to the address inputs of the EEPROM, the data inputs/outputs of the EEPROM, and the high-impedance control input of the processor. An EEPROM programming means electrically connects to the connector for activating the high-impedance control input of the processor to render the address outputs of the processor to a high-impedance state during a programming operation, and for transmitting address information and data to the address inputs and data inputs/outputs of the EEPROM, respectively during the programming operation to write data into said EEPROM. Consequently, the EEPROM need not be removed from its socket or printed circuit board during programming, and may be programmed in the field.

DETAILED DESCRIPTION OF THE PREFERRED EMBODIMENTS

Figure 1:
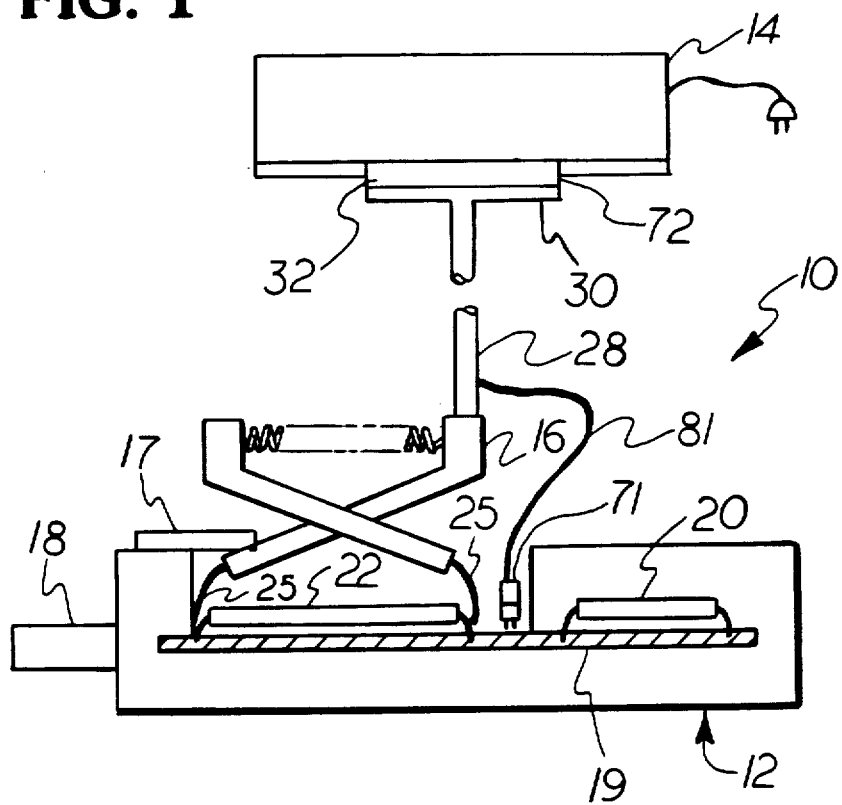
FIG. 1 is a schematic bottom sectional view of an electronic lock, a programmer and a connctor in accordance with the present invention.

FIG. 1 schematically illustrates an electronic lock and programmer combination generally designated 10 in which the invention is embodied. The combination 10 includes an electronic lock 12, a memory programmer 14, and a connector 16 which electrically connects the programmer 14 to a circuit board 19 within the electronic lock 12. By way of example, the programmer 14 is a "Data I/O" brand PROM programmer and the connector 16 is an "IC clip" which is used to make a temporary electrical connection to pins of an EEPROM 22 and a processor 20 within the electronic lock. By way of example, the processor 20 may comprise either a micro-computer having an internal RAM or a processor connected to an external RAM. The IC clip is a standard component and is spring-biased in the manner of a wide clothespin to clamp against opposite sides of the EEPROM 22. The IC clip 16 has a number of claw-like members which engage a respective number of pins stemming from the EEPROM 22. The claw-like members 25, 25 are also electrically connected to a ribbon cable 28 which terminates in a plug-in connector 30 which has claw-like members 32, 32 which plug into the programmer 14. The connector 30 is also a standard component and physically resembles an EEPROM integrated circuit package.

The processor 20 and the electrically erasable programmable read-only memory (EEPROM) 22 are plugged or soldered into the circuit board 19 along with other electrical components (described below). Electronic lock 12 further comprises a read head 17 for reading a magnetic key card or other key to determine if the key contains lock combination data which matches one or more lock combinations stored within the lock, and a latch bolt 18 which establishes either the locking or unlocking condition of the electronic lock 12. FIG. 1 illustrates electronic lock 12 with a back panel (not shown) open to expose the processor 20 so that the connector 16 may be connected thereto as shown. However, during normal operation of the electronic lock 12, the connector 16 is removed and the back panel is put in place to seal the electronic lock 12.

Figure 2:
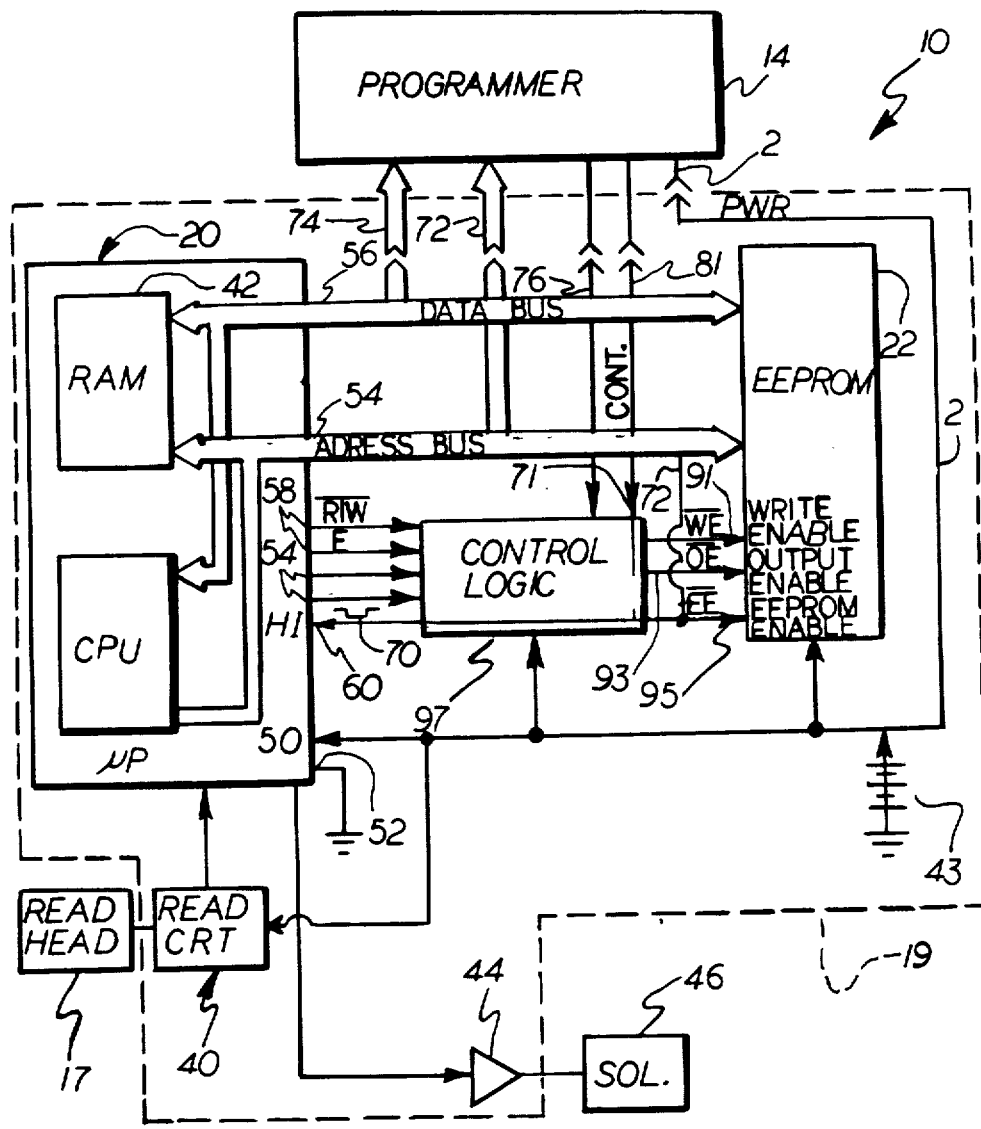
FIG. 2 is a block diagram illustrating electronic components within the electronic lock and programmer of FIG. 1.

FIG. 2 schematically illustrates electronic components within the circuit board 19 and other components of the combination 10. As illustrated in FIG. 2, the circuit board 19 further includes a read circuit 40 which receives the output of the read head 17 and translates such output into digital form for transmission to the processor 20. A random access memory (RAM) 42 within the processor 20 may contain the one or more lock combinations associated with the electronic lock 12, and after reading the output of the read circuit 40, the processor compares the lock combination data contained on the key card to the lock combination or combinations stored in the RAM 42 or the EEPROM 22. If there is a match, the processor 20 activates a solenoid 46 via a driver 44 to operate a locking mechanism (not shown) for the latch bolt 18.

As further illustrated in FIG. 2, the processor 20 includes a variety of inputs and outputs. Pins 50 and 52 are DC power and ground, respectively. Pins 54 which, by way of example, may number eleven are processor outputs which provide addressing information to the EEPROM 22 and RAM 42. Pins 56 which, by way of example, may number eight are inputs/outputs of the processor and read and write the data contained in the EEPROM 22 and RAM 22. Pins 58 which, by way of example may number two are control outputs of the processor to transmit control information to the EEPROM 22. One of the control outputs 58, R/W not, signals the EEPROM and RAM whether the processor is currently performing a read operation or a write operation, and the other control output 58, E, provides a timing clock signal to synchronize communication with the EEPROM 22 and RAM 42. A pin 60 of the processor 20 is a high-impedance, status control input of the processor which determines the status of the inputs and outputs of the processor. The programmer 14 communicates with the pin 60 via a wire 81 which clips onto an exposed pin 71. Application of a binary zero level to the status control input 60 of the processor renders the processor inputs, inactive and renders the processor outputs 54, 56 into a high-impedance condition in which high-impedance condition the outputs of the microprocessor 20 are insensitive to standard electronic signals applied to them. Such processor 20 is an off-the-shelf item. The control outputs 56, 58 are preferably put into the high-impedance state by activation of the status control input 60 although the type of processor 20 selected does not specify this. Consequently, control logic circuitry 97 is provided to simulate such high-impedence outputs by open collector or high-impedance outputs, or other logic circuitry.

The outputs 54 of the processor 20 also connect to address inputs of the RAM 42 in an internal common bus arrangement. Inputs/outputs 56 of the processor 20 similarly connect to data inputs and outputs of the RAM 42, and outputs 58 of the processor 20 similarly connect to control inputs of the RAM 42 in a common bus arrangement. The outputs 54 of the processor 20 not only determine a precise memory location within the EEPROM 22 or the RAM 42 but also which of the memory devices, EEPROM 22 or RAM 42, are addressed. The EEPROM 22 also includes a write enable input 91, a read or output enable 93 to direct the EEPROM to present its data for reading by the processor or programmer and an EEPROM enable 95. As noted above, during normal operation of the electronic lock 12, neither the programmer 14 nor the connector 16 is connected to the electronic lock, and the processor 20 reads data from the EEPROM 22 and the RAM 42 and writes data into the RAM 42 and EEPROM 22 as necessary to operate the lock.

The EEPROM 22 may be programmed before installation into the circuit board 19, which programming and installation takes multiple steps. First, a blank, non-programmed EEPROM is plugged into a programmer and programmed for a first time. Then, the EEPROM is removed from the programmer and plugged into the circuit board 19, and finally the EEPROM is soldered into the circuit board 19. However, after such installation into the circuit board 19, it may be desirable to reprogram the EEPROM 22. Alternately, it may be desirable to initially program a blank EEPROM 22 after it has been installed and soldered into the circuit board 19 if not programmed before such installation. In which cases, the connector 16 is clamped onto the EEPROM 22 as noted above. The connector 16 includes a multiplicity of the claw-like members 25 which, by way of example, connect to each of the pins of the EEPROM 22. The circuit board 19 may be powered during programming by a battery 43 or the programmer 14. The programmer 14 also connects via the connector 16 to the eleven outputs 54, the eight inputs 56, and the single input 60 of the processor 20 and the inputs 91 and 93 of the EEPROM. During programming, the programmer 14 initially applies a binary zero signal 70 to the status control input 60 of the processor 20 to render the inputs 56 of the processor 20 de-active and the outputs 54, 56 (and possibly 58) to the high-impedance, non-sensitive condition. Thus, the processor 20 is isolated from the subsequent programming activity implemented on the EEPROM 22. Next, the programmer 14 transmits address binary signals via address lines 72 to address the EEPROM 22 and the multiplicity of memory locations therein. Simultaneously, the programmer 14 transmits data via data lines 74 to the data inputs of the EEPROM 22 to write such data into EEPROM 22 and also transmits control information via control lines 76 to control such writing operation. Because the programmer 14 selects the EEPROM 22 via suitable address signals on the data lines 72, the RAM 42 is not affected by the programming of the EEPROM 22. Thus, the combination 10 is capable of programming the EEPROM while it is permanently installed in the circuit board 19 without requiring removal of any of the components of the circuit board 19 and without damage to the processor 20. After such programming, the connector 16 is removed from the EEPROM 22 and the back panel of the electronic lock 12 replaced to seal the electronic lock.

By the foregoing, an electronic lock and programmer combination embodying the present invention has been disclosed. However, numerous modifications and substitutions may be made without deviating from the scope of the invention. For example, instead of the temporary connector 16, it may be desirable to provide a permanent connector plug to the circuit board 19, which plug is electrically connected to each of the outputs 54, each of the inputs 56, the control logic 97, the power 50, ground 52 and the status control input 60 of the processor. In this embodiment, a suitable mating connector is provided to connect such inputs and outputs of the processor 20 to the ribbon cable 28, the connector 30 and the programmer 14. Also, if the processor 20 renders the control outputs 58, 58 into the high-impedance state when the status control input 60 is activated, then the control logic 97 may be removed and the control outputs 58 connected directly to the EEPROM 22. Therefore, the invention has been disclosed by way of illustration and not limitation, and reference should be made to the following claims to determine the scope of the invention.

What is claimed is:

1. In an electronic locking system having a processor and an electrically erasable programmable read-only memory (EEPROM) and a random access memory (RAM) supported within said electronic locking system, said processor having address outputs electrically connected to address inputs of said EEPROM and of said RAM to address memory locations within said EEPROM and within said RAM, data inputs electrically connected to data inputs/outputs of said EEPROM and of said RAM to receive data from said EEPROM and from said RAM, and a high-impedance control input for transforming said address outputs of said processor to a high-impedance state and deactivating said processor inputs for isolating said processor, the improvement comprising:

a connector electrically connected to said address inputs of said EEPROM, said data inputs/outputs of said EEPROM, and said high-impedance control input of said processor, and EEPROM programming means electrically connected to said connector for activating said high-impedance control input of said processor to deactivate said inputs of said processor and render said address outputs of said processor to a high-impedence state during a programming operation, and for solely transmitting address information and data to said address inputs and data inputs/outputs of said EEPROM, respectively during said programming information to write data into said EEPROM, said RAM being unaffected during said programming of said EEPROM.

2. An electronic locking system as set forth in claim 1 wherein said processor and said EEPROM are soldered into a common circuit board.

3. An improvement as set forth in claim 1 wherein said connector is a temporary, clip-type and is clipped onto connector pins of said EEPROM.

4. An electronic locking system as set forth in claim 1 further comprising a random access memory having address inputs connected to said address outputs of said processor and data outputs connected to said data inputs of said processor and wherein said connector electrically connects to said address inputs of said random access memory and to said data outputs of said random access memory, and said programming means addresses said EEPROM during said programming operation.

5. In combination with a circuit board including a processor connected therein and means defining an electrically programmable read-only memory and a random access memory connected therein, said processor having address outputs connected to address inputs of each of said memory means to address memory locations within each of said memory means, data inputs connected to data inputs/outputs of each of said memory means to receive data from each of said memory means, and a high-impedance control input for transforming said address outputs of said processor to a high-impedence condition and deactivating said processor inputs for isolating said processor, the improvement comprising:

memory programming means electrically connected to said address inputs of said electrically read only memory of said memory means, said data inputs/outputs of said electrically read only memory of said memory means, and said high-impedance control input of said processor, for activating said high-impedance control input of said processor to render said data outputs and inputs of said processor to said high-impedence condition during a programming operation, and for transmitting address information and data solely to said address inputs and said data inputs/outputs of said electrically programmable read only memory of said memory means during said programming operation to write data into said electrically programmable read only memory of said memory means, said random access memory being unaffected during said programming operation.

6. An improvement as set forth in claim 5 further comprising a temporary clip-type connector which is clipped to connector pins of said electrically programmable read-only memory and provides said electrical connection to said programming means.

7. A combination as set forth in claim 5 wherein said circuit board further comprises a random access memory having address inputs connected to said address outputs of said processor and data outputs connected to said data inputs of said processor, and wherein said programming means addresses said memory means during said programming operation.

8. An improvement as set forth in claim 6 wherein said connector includes a cable which terminates at one end at said clip-type connector and terminates at its other end at a plug means for plugging into said memory programming means and making electrical connections therein.

9. An apparatus as set forth in claim 5 wherein activation of said high-impedance control input of said processor also renders said data inputs of said processor insensitive during said programming operation.

10. An apparatus as set forth in claim 5, wherein said processor further includes control outputs, and further comprising control logic circuitry connected to said programming means and said control outputs to simulate high-impedance status of said control outputs of said processor during said programming operation.

11. A process for programming an electronic lock circuit board having a processor and a random access memory (RAM) an electrically erasable programmable read-only memory (EEPROM) connected therein, said processor having address outputs connected to address inputs of said EEPROM and RAM to address memory locations within said EEPROM and RAM, data inputs electrically connected to data inputs/outputs of said EEPROM and RAM to receive data from said EEPROM and RAM, and a high-impedance control input for transforming said address outputs of said processor to a high-impedance state and for deactivation of said processor inputs for isolating said processor, said process comprising the steps of:

while said processor and said EEPROM are connected to said circuit board, attaching one end of an electrical connector to said address inputs of said EEPROM, to said data inputs/outputs of said EEPROM, and to said high-impedance control input of said processor, attaching an EEPROM programmer to the other end of said connector, and operating said EEPROM programmer to activate said high-impedance control input of said processor to render said address outputs and said inputs of said micro-processor to said high-lmpedence state during a programming operation, and transmit address information and data solely to said EEPROM during said programming operation to write data into said EEPROM, said RAM being unaffected during said programming operation.

12. A process as set forth in claim 11 wherein the step of attaching said connector comprising the step of clipping a clip-type connector to connector pins of said EEPROM to make an electrical connection to said EEPROM and processor.

13. An improvement as set forth in claim 5 wherein said electrically programmable read-only memory is an EEPROM.

* * * * *